United States Patent [19]

Chahroudi

[11] 4,298,444
[45] * Nov. 3, 1981

[54] METHOD FOR MULTILAYER THIN FILM DEPOSITION

[75] Inventor: Day Chahroudi, Berkeley, Calif.

[73] Assignee: Heat Mirror Associates, Palo Alto, Calif.

[*] Notice: The portion of the term of this patent subsequent to May 27, 1997, has been disclaimed.

[21] Appl. No.: 106,595

[22] Filed: Dec. 26, 1979

Related U.S. Application Data

[62] Division of Ser. No. 950,356, Oct. 11, 1978, Pat. No. 4,204,942.

[51] Int. Cl.³ .............................................. C23C 15/00
[52] U.S. Cl. ............................ 204/192 R; 204/192 P
[58] Field of Search ............... 204/192 R, 298, 192 C, 204/192 P

[56] References Cited

U.S. PATENT DOCUMENTS

| 2,734,478 | 2/1956 | Reynolds et al. | 118/8 |
| 3,793,167 | 2/1974 | Glaser | 204/298 |
| 3,838,028 | 9/1974 | Needham et al. | 204/298 |
| 3,945,903 | 3/1976 | Svendor et al. | 204/192 |
| 3,976,555 | 8/1976 | Von Hartel | 204/192 |
| 4,132,624 | 1/1979 | King et al. | 204/298 |
| 4,151,064 | 4/1979 | Kuehule | 204/298 |

OTHER PUBLICATIONS

Maissel O. Glang, "Handbook of Thin Film Technology", McGraw-Hill, 1970, pp. 1-80 to 1-91.
W. D. Holt, "The Case for Air-to-Air In-Line Systems".

Primary Examiner—Delbert E. Gantz
Assistant Examiner—William Leader

[57] ABSTRACT

Apparatus for sputter depositing two or more layers of material onto a substrate in one operation includes an evacuable chamber containing a transport mechanism, substrate support, and at least two deposition units situated proximate the support. The transport mechanism moves the substrate to and from the support. When at the support, the substrate is passed by one deposition unit and then the other for sputter deposition of a thin film of material by each unit.

4 Claims, 3 Drawing Figures

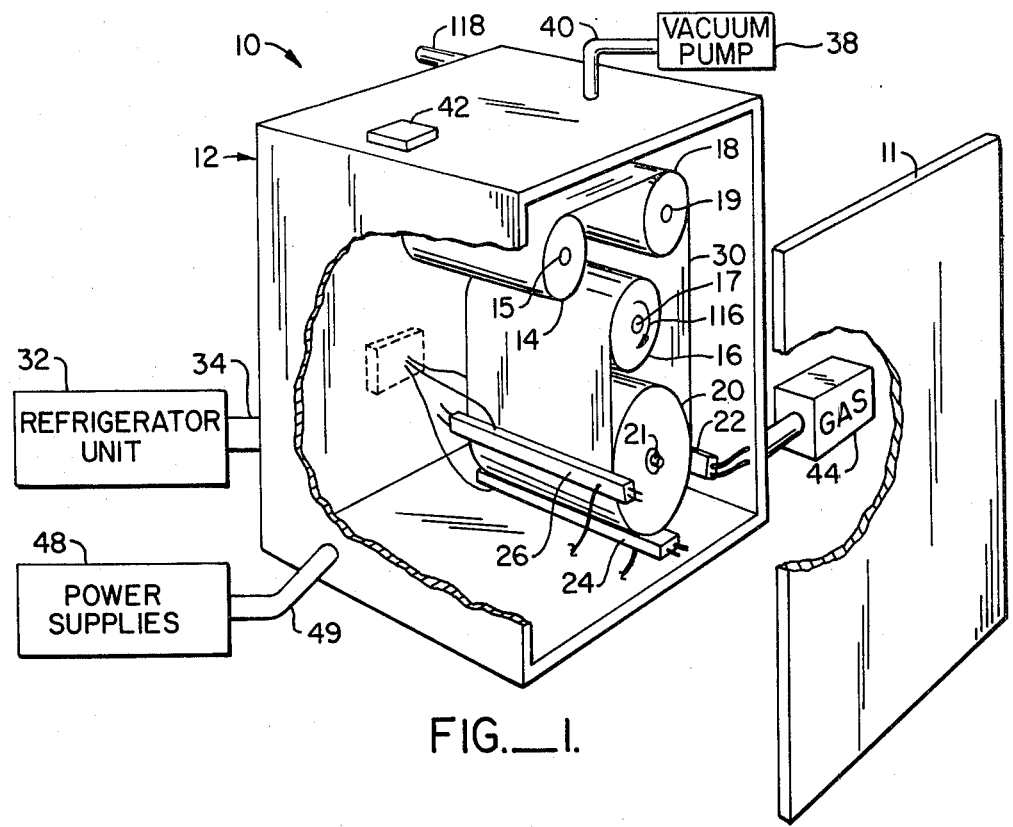
FIG._1.
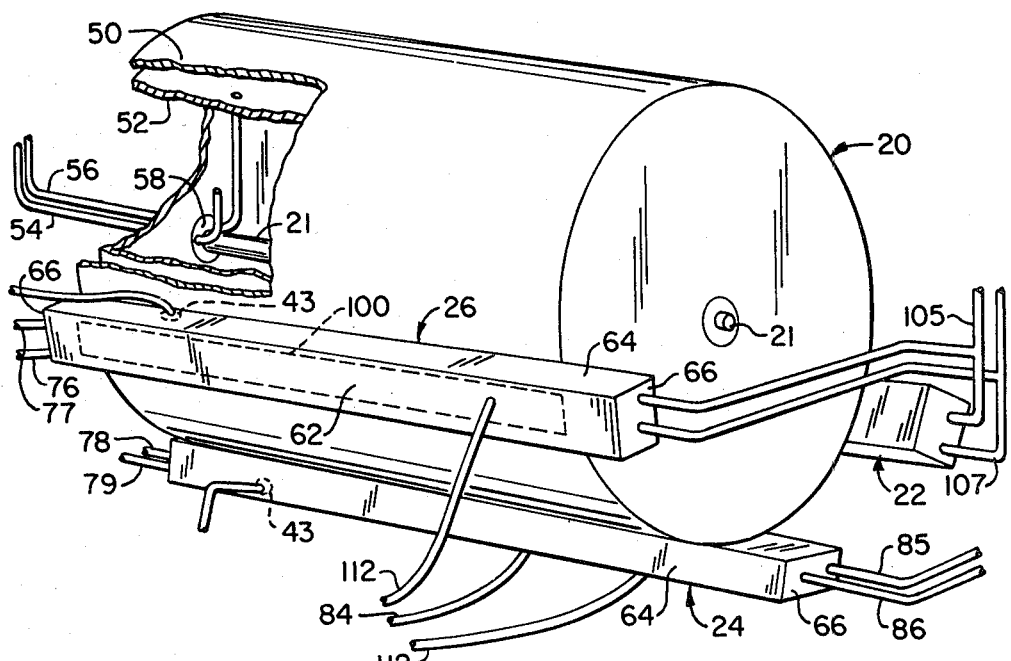
FIG._2.

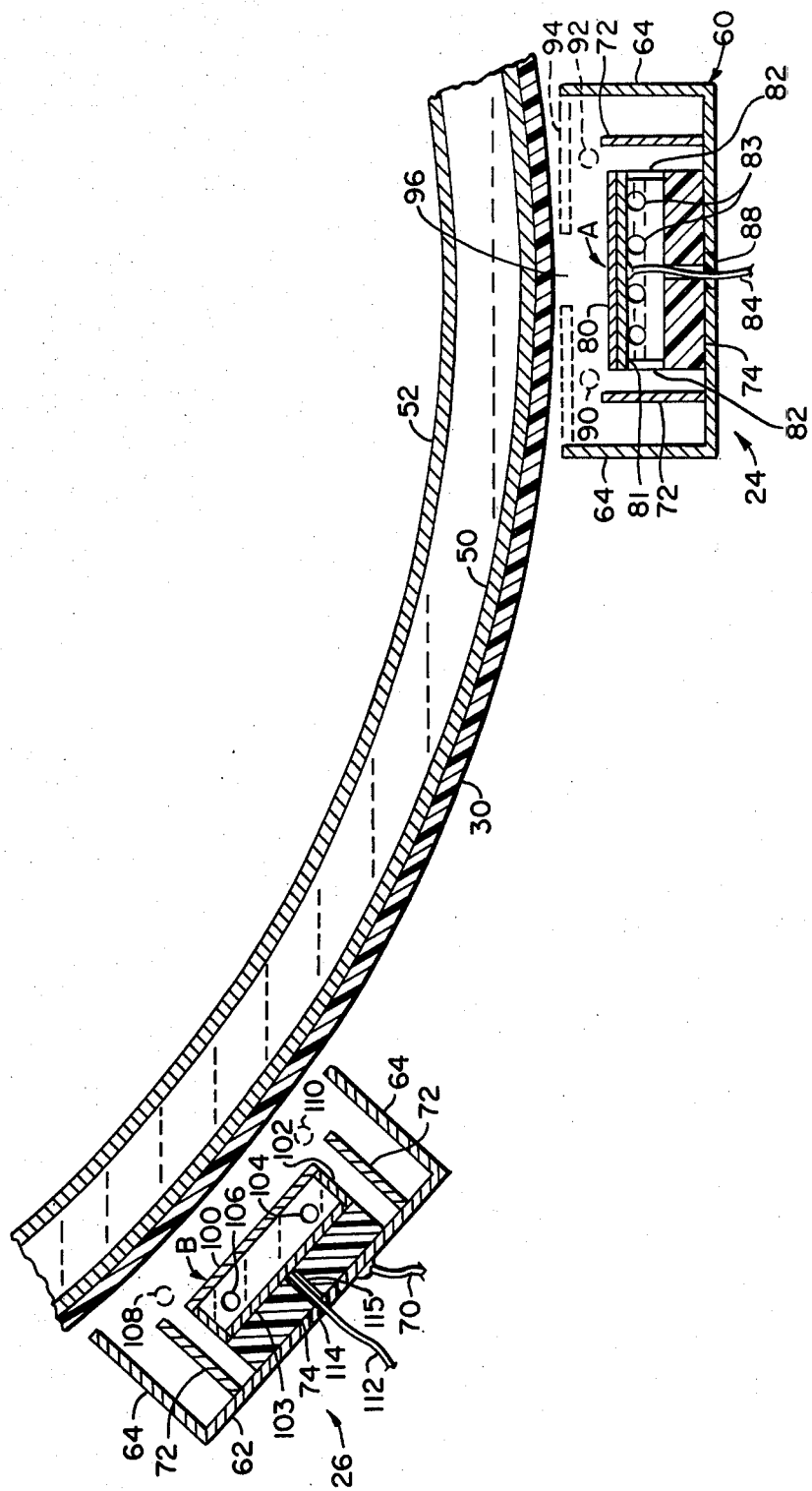
FIG._3.

METHOD FOR MULTILAYER THIN FILM DEPOSITION

This is a Division of application Ser. No. 950,356, filed Oct. 11, 1978, now U.S. Pat. No. 4,204,942.

The present invention pertains generally to apparatus for depositing thin films of material onto a substrate and more particularly to apparatus for depositing multiple thin film layers onto a long, flexible sheet of substrate.

BACKGROUND AND SUMMARY OF THE INVENTION

The copending Application Ser. No. 870,397 filed Jan. 18, 1978, in the names of Day Chahroudi and John Brookes entitled "Transparent Infrared Radiation Reflection System" and assigned to the present assignee describes an energy-efficient material that reflects infrared (thermal) radiation incident thereon, yet is transmissive to visible and other solar radiation. Generally, the material includes a transparent flexible plastic substrate upon which is deposited a thin film of metal between layers of dielectric or semiconductor material. Contemplated as a substrate are such flexible plastics or polymer films as thin acrylics or those sold under the trademarks Mylar and Tedlar. It is contemplated that such substrate will have a thickness in the range of 0.5 to 20 mils while the thin film deposits will have a thickness between 50 and 2,000 angstroms.

There are at least three separate techniques presently known for depositing thin films of material of the thickness contemplated: The substrate may be coated chemically, by vacuum evaporation or by sputtering. Unfortunately, the chemical or vacuum evaporation deposition techniques do not lend themselves to coating large areas with film deposits of uniform optical thicknesses.

The sputtering technique has been found most useful of the three in coating large, long, flexible sheets of substrate with thin film deposits of uniform. Briefly, sputtering is a known metal deposition process that requires a cathode, an anode, a gas atmosphere for establishing a gas-discharge plasma (somewhat like that of fluorescent lighting), a source of sputtered material—the target (which is the cathode in this case) and an evacuable chamber to house these items. The chamber is partially evacuated to a pressure of anywhere from 1 to 100 millitorr and an electric field of several hundred volts established between the cathode and anode to produce glow discharge or plasma. The substrate is positioned within a few inches of the cathode (target), usually just outside the cathode dark space. Ions from the plasma are accelerated toward the cathode by the electric field where they strike and transfer their kinetic energy to atoms of metal, causing them to be ejected as a hot gas. This metal gas condenses on and coats the substrate.

If the sputtering process takes place in a gas that does not react with the atoms of the target (e.g., an inert gas such as argon) the coating deposited on the substrate will remain relatively pure. However, an admixture of a normally reactive gas (e.g., oxygen or fluorine) to the argon gas can be used to change the composition of the sputtered deposit to obtain, for example, an oxide or fluoride of the deposited metal.

In order to sputter deposit two or more layers of a material onto a flexible substrate of the type described above, each separate coating has been applied in a separate chamber in order to avoid having effluents from one sputtering process from contaminating the other. It was found that even with special care and handling techniques, which added to the cost of manufacturing the coated plastic, transferring the substrate from a chamber after one coating process to another chamber for another coating process tended to introduce impurity into the thin film deposits. It was soon realized that the time between deposits of the material onto the substrate was preferably minimized to thereby keep impurities without the particular thin film layer, be it metal or insulator. That is, when more than one coating is deposited onto a substrate, in order to minimize contamination, a great deal of effort generally goes into the isolation of each coating station from the other. Further, the acts of actually handling the substrate during the coating process (e.g., during transfer from one chamber to another) tends to produce a degree of surface roughening. This roughening or abrasion causes deleterious effects in the properties of the film deposited.

Accordingly, the present invention provides apparatus for sputter depositing two or more layers of material onto a flexible substrate, such as metal foil or plastic films, in a single chamber, yet isolating each individual deposition process from the other. Transfer of the substrate from one deposition chamber to another is obviated.

According to the present invention, therefore, there is provided an evacuable chamber containing three separate, individual deposition or sputtering stations arranged proximate a support member across which is moved the substrate by a transport mechanism. Each individual deposition station includes apparatus for sputtering a metal onto the substrate, and a housing that encloses the sputtering apparatus for containing the particular plasma used in the sputtering process. Each deposition station is provided with its own individual source of gas used to produce the plasma.

In the embodiment described herein, an evacuable chamber contains a support member, in the form of a cylinder that is rotatable about its longitudinal axis, and three individual deposition stations positioned at predetermined locations about the circumferential surface of support. The housing which encloses the sputtering mechanism of each deposition station opens toward the support member. The peripheral portions of each deposition station housing that define the opening are spaced a predetermined distance from the support member, forming an interstitial gap therebetween. This interstitial gap is dimensioned to allow the substrate to pass therethrough yet restrict effluent flow from the housing of the particular gas communicated to each individual deposition station. Further, the interstitial gap between the deposition station housing and substrate support is dimensioned so that a low probability of conductance of gaseous atom transmission from the chamber into the housing is obtained; that is, the smaller the gap, the lower the probability that gaseous atoms will find their way to and through the gap, into the housing interior. In addition, the gas introduced into the housing of each deposition station is maintained at a pressure that is higher than that of the chamber which, in turn, limits the level of gaseous contamination that can emanate from the chamber to a low value.

A transport mechanism, including a play-out roll and take-up roll, is also contained within the chamber to linearly advance the substrate along the support and past the series of three deposition stations.

The present invention effectively provides apparatus that almost simultaneously coats long, flexible sheets with multiple sputter depositions of material, yet minimizes the possibility of impurities produced by one deposition process effecting an adjoining deposition process. Thus, one deposition process involving a reactive metal being sputtered in a reactive atmosphere can take place simultaneously with and next to a second deposition process involving a metal being sputtered in an inert atmosphere.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a partly cut-away perspective view of the apparatus of the present invention;

FIG. 2 is a perspective view, partly in section, illustrating the support member and the three deposition stations arranged thereabout; and FIG. 3 is a partial sectional view of the support member and two of the three deposition stations of the present invention.

DETAILED DESCRIPTION OF THE PREFERRED EMBODIMENT

For the purposes of best illustrating the invention, the following description will be directed to apparatus for coating a long, flexible substrate with a first sputter deposit of insulation, a second sputter deposit of an electrical conductive material, and a third sputter deposit of insulation that is the same as the first.

Accordingly, referring to FIG. 1, there is illustrated the apparatus of the present invention for such multilayer deposits of thin films upon a long sheet of flexible substrate. The apparatus, generally designated by the reference numeral 10, includes an evacuable chamber 12 with door 11 removed to show mounted interior of the chamber play-out roll 14, take-up roll 16, idler drum 18 and support cylinder 20. The play-out and take-up rolls, as well as idler drum 18, are rotatably mounted to a portion of the chamber 12 via spindles 15, 17 and 19, respectively. Similarly, support cylinder 20 is rotatably mounted to spindle 21. The spindles 15, 17, 19 and 21 are generally horizontally oriented and parallel to one another. Also mounted within the chamber at spaced locations about the outer circumferential surface of the support cylinder 20 are deposition stations 22, 24 and 26.

As illustrated in FIG. 1, a substrate 30 (typically a long, thin sheet of plastic) is mounted upon play-out roll 14 and then caused to extend from the play-out roll to take-up roll 16 via idler drum 18 and support cylinder 20, passing through (as will be more particularly shown below) the interstitial space between deposition stations 22, 24 and 26 and support cylinder 20.

Apparatus 10 further includes a refrigeration unit 32 which is communicated to the chamber 12 via a conduit 34 to provide the support cylinder 20 and deposition stations 22–26 with a coolant. For clarity, conduits communicating the coolant to the individual deposition stations are not fully illustrated in the Figures.

A vacuum pump 38 is communicated to chamber 12 via exhaust conduit 40. With chamber door 11 securely attached to chamber 12 so that it hermetically seals the chamber, the pump 38 can partially evacuate the chamber to pressures of 1 millitorr. Sensor 42 is provided to monitor the chamber pressure.

A gas supply unit 44 communicates an admixture of reactive gas to stations 22 and 26 to provide a reactive sputtering process. Similarly, gas supply unit 44 supplies an inert or non-reactive gas to deposition station 24 for generating the gas-discharge plasma that will provide the sputtering environment for that station. In addition, each deposition station 22, 24, 26 is provided with a separate source of electrical power to control the sputtering taking place at each station. Accordingly, there is provided power supplies 48 to supply the corresponding deposition stations with the appropriate high voltage required for the sputtering process. Again for clarity, the conduits and electrical lines which communicate the gases and electrical power to each deposition station are not fully illustrated in the Figures.

Referring now to FIG. 2, it can be seen that support cylinder 20 includes an outer cylindrical jacket 50 and an inner cylindrical jacket 52. The outer and inner jackets 50 and 52 relatively situated concentric to each other are dimensioned so that a space is formed between the two jackets. Both outer and inner jackets 50 and 52, respectively, are formed from hot rolled steel. Additionally, the outer surface of jacket 50 (and, therefore, support cylinder 20) is provided with a polished, hard chrome coating.

Inlet and outlet coolant lines 54 and 56, respectively, carry a coolant to and from the support cylinder. The lines 54, 56 pass through a rotating coaxial seal 58 of known construction to communicative water (cooled to about 22° C.) to and from the interstitial area between jackets 50 and 52 of support member 20, thereby cooling the support cylinder.

Referring now to both FIGS. 2 and 3, the deposition stations 22, 24 and 26 can now be described. At the outset, it will be noted that the structure of all three stations is essentially the same. Accordingly, the same part numbers wil be used to designate those elements which are identical, while structural differences will be noted and given different reference numerals as appropriate. Further, deposition stations 22 and 26 are in all respects identical and, therefore, only deposition station 26 is illustrated in FIG. 3. Therefore, any discussion of the structural and functional aspects of deposition station 26 will apply equally to deposition station 22.

Accordingly, as illustrated in FIGS. 2 and 3, deposition stations 22, 24 and 26 are elongate structures arranged at spaced locations about circumferential surface of support cylinder 20. Each deposition station is oriented with its longitudinal dimension generally parallel to the axis of support cylinder 20. Each deposition station includes a box-like housing 60 that is formed from a base wall 62, side walls 64, and end walls 66. Side and end walls terminate to define an opening that is positioned in spaced, confronting relation with the circumferential surface of support cylinder 20. Each housing 60 has electrically coupled thereto a ground lead 43 which electrically communicates the housing 60 to an electrical common (not shown). The outer and inner jackets 50 and 52, respectively, of support cylinder 20 are also electrically coupled to this common.

Mounted interior of housing 60 and extending generally parallel to side walls 64 are side shields 72, which act to quench plasma at the side walls of the cathode structures A and B of deposition stations 24 and 26, respectively, and thereby inhibit side sputtering. Affixed to base wall 62 of each housing 60 is a cathode mount 74, which is fabricated from a material having high insulating qualities.

The cathode structure A of deposition station 24 includes a long planar target 80 of conductive metal that is soldered or otherwise securely (and electrically) attached to a copper target support plate 81. In turn, support plate 81 is mounted to cathode mount 74 via stands 82, which are affixed to the mount 74 so that the target, target support plate, and stands are electrically isolated from the housing 60. Coolant tubing 83 is attached to the target support plate 81 for extracting heat from the support plate and target 80 attached thereto when a coolant is passed through the tubing. Inlet and outlet lines 78 and 79 communicate a coolant (typically water) to tubing 83 in such a manner so as to keep a flow continuing therethrough. Additionally, attachment of the coolant lies 78, 79 to the tubing 83 is made via appropriate insulation devices (not shown) so that any electrical shorts of the high voltage to ground are avoided. A high-voltage lead 84 is electrically secured to support plate 81 to electrically communicate the support plate and target to the corresponding one of power supplies 48.

The cathode structures B of deposition stations 22 and 26 are constructed in a similar fashion. A target 100, fabricated from a reactive metal (e.g., one that will react with the gas supplied for plasma generation to produce a deposit having the qualities of an insulator) is attached to cathode mount 74 by support member 102 in such a way as to isolate the target and support member from the housing 60. A bottom plate 103 overlays cathode mount 74. Target 100, support member 102 and bottom plate 103 are constructed so that they are all electrically one element and are configured to form an elongate, water-tight reservoir into which coolant (again, typically water) may be introduced via inlet port 104 to cool the target. Egress is provided by outlet port 106. The coolant is communicated between refrigeration unit 32 and deposition station 26 (and 22) by coolant lines 76, 77, the coolant lines being attached to ports 104, 106 via appropriate insulating apparatus (not shown) so that electrical isolation of the target 100 from housing 60 is maintained.

A high-voltage lead 112 is electrically attached to bottom plate 103 (and, therefore, target 100) to electrically communicate the target to its corresponding one of power supplies 48. As indicated in FIG. 3, high-voltage lead 112 passes through housing 60, via an insulating grommet 114 situated in an aperture in housing 60 and bore 115 formed in cathode mount 74.

In operation, a cylindrical roll of a long strip of plastic substrate (typically polyester) is mounted to spindle 15, forming play-out roll 14. A portion of the substrate is played out so that it extends along a path that is around idler drum 18, support cylinder 20 (through the interstitial spacings between the deposition stations and support member), terminating at take-up roll 16. With the substrate 30 so positioned (as illustrated in FIG. 1) door 11 is attached to chamber 12, hermetically sealing the interior of the chamber. Vacuum pump 38 begins to evacuate chamber 12 until an interior pressure of approximately two millitorr is reached. At this time, gas supply unit 44 begins supplying an admixture of a reactive gas to deposition stations 22 and 26, via gas lines 105, 107, in sufficient quantity to establish and maintain a pressure of 11 millitorr within the housings 60 of the deposition stations. Similarly, the gas supply unit 44 provides deposition station 24 with a flow of non-reactive gas via gas lines 85, 86, which is introduced into housing 60 of deposition 24 via inlet 90 and evacuated via outlet port 92. The flow of the non-reactive gas introduced into housing 60 of deposition station 22 should be sufficient to maintain the pressure therein also at approximately 11 millitorr.

A negative high-voltage potential of approximately 500 volts at 10 amps is supplied by the corresponding ones of power supplies 48 to the targets 100 of deposition stations 22 and 26; at the same time, a negative high voltage of approximately 400 volts at 2.5 amperes is applied to target 80 of deposition station 24. At the same time, take-up roll 16 is caused to begin revolving in the direction of arrow 116 by motor means 118 which is coupled to the take-up roll via an appropriate drive mechanism (not shown) such as a continuous belt. As take-up roll 16 rotates, substrate 30 is played out from play-out roll 15 and across support cylinder 20 so that the substrate continuously passes proximate each deposition station. Thereby, the substrate is first caused to have deposited a layer of insulation (the product of sputtering a reactive metal in the admixture of reactive gas provided deposition station 22).

Next, a layer of electrically conductive metal is deposited onto the insulator film by deposition station 24 by the sputtering of target 80 in an inert or non-reactive atmosphere.

Finally, deposition station 26 deposits a second film of insulation and the now multilayered flexible substrate is wound upon take-up roll 16.

The rate at which substrate 30 is moved by the respective deposition stations is a function of the type of sputtering conducted and the coatings desired. However, under the conditions of voltages and gases set forth above, it is presently preferred that substrate 30 move at a rate of approximately nine inches per minute past the respective deposition stations.

In addition, it is well known that the sputtering process tends to heat the substrate. To avoid melting or otherwise damaging substrate 30, support cylinder 20 is constructed, as described above, to remove thermal energy from the substrate during the sputtering process. However, to ensure good thermal conductivity between the outer surface of the support cylinder and substrate, play-out roll 14 and/or idler drum 18 are preferably constructed with a predetermined amount of drag that works against the pull on the substrate by take-up roll 17 (and its associated motor 118). This drag will act to tension the substrate against support cylinder 20, thereby establishing good thermal contact therebetween. The amount of such drag is a matter of choice which can vary depending upon the particular substrate which is to be coated. Moreover, creation of such drag can be by way of any one of several known methods—such as controlling the friction engagement of play-out roll 14 and idler drum 18 on their respective spindles 15 and 19.

In addition, the longitudinal dimension of each target 80, 100 used at deposition stations 22, 24 and 26 is preferably sufficient to allow the target to extend somewhat beyond the ends of support cylinder 20. This ensures that the substrate will be evenly coated—even out to and at the edges.

As noted above, the coating process conducted at deposition station 24 sputters a metal in an inert or non-reactive atmosphere to produce a coating of good electrical conductivity that is sandwiched between two coatings of electrical insulation. In order to pressure the purity of the metal film (and its electrical conductivity) deposited on the substrate 30 (actually upon the previously deposited film of insulation, the atmosphere interior of housing 60 of deposition station 24 should be kept free of impurities. Accordingly, the purity of the deposition's atmosphere is maintained, in part, by establishing the pressure differential between the interior of the housing of deposition station 24 and pressure of the interior of chamber 12. This pressure differential limits, at a low level, the amount of gaseous impurities that can enter the interior of housing 60. Moreover, as noted above, the limited spacing between the support cylinder 20 and periphery of housing 60, limits the passage through which impurities (in the form of gas atoms) emanate from chamber 12 into the housing. Accordingly, the interstitial spacing between the periphery is preferably in the range of 1-2 millimeters. This small gap establishes a low probability of conductance of gaseous atom transmission and acts as a barrier to the entry of potential impurities that ensures the purity of the inert or non-reactive gas atmosphere in which sputtering is conducted at deposition station 24.

The relative quantities of the mixture of reactive gas in which sputtering takes place at deposition stations 22 and 26 can be similarly maintained. Thus, the interstitial spacing between housing 60 of deposition stations 22, 26 and support cylinder 20 are also preferably in the 1-2 millimeter range.

Thus, the present invention provides apparatus for multilayered deposition of thin films upon a substrate that avoids the necessity of handling the substrate between the deposition of each respective film. Moreover, the present invention provides apparatus that allows the deposition of two or more layers of material, the materials being of properties that require deposition in different atmospheres where said atmospheres are mutually poisonous. For example, a first metal can be sputtered in a reactive atmosphere to form a first deposit on the substrate. Then, a second metal can be sputtered in an inert atmosphere to form a second deposit. Yet the atmosphere of either sputtering process remains unaffected by the other process.

While the above provides a full and complete disclosure of the preferred embodiment of the invention, various modifications, alternate constructions and equivalents may be employed without departing from the true spirit and scope of the invention. For example, if desired, deposition station 24 can be provided with deposition shield 94 which narrows the opening defined by the terminal peripheries of side and end walls 64, 66 of housing 60. Shield 94 (shown in phantom in FIG. 3) forms a long, narrow slot 96 to, in effect, focus the sputtered metal from target 80 as it is laid down upon the previously deposited layer of insulation. The metal film is thereby more nucleated and continuous.

Therefore, the above description and illustrations should not be construed as limiting the scope of the invention, which is defined by the appended claims.

What is claimed is:

1. A method for depositing thin films of at least a first and a second material onto an elongate substrate, said method comprising the steps of:

providing a vacuum chamber containing at least a first and a second means for depositing the first and second material;

separately housing the respective deposition means in enclosures each having terminal portions forming an edge that defines an opening;

transporting the substrate to and from the first and second deposition means;

supporting the substrate proximate the respective openings in confronting relationship thereto to form a generally uniform interstitial gap between each said edge of each said enclosure and said supporting means;

establishing an electric field between the respective deposition means and the supporting means;

sputtering the materials from the respective deposition means onto the supported substrate to deposit thin films of said materials on said substrate; and introducing and maintaining gasses into the respective enclosures at pressures greater than the internal pressure of the chamber, the substrate being supported so that the interstital gap restricts the outflow of said gasses from the respective enclosures.

2. The method of claim 1 wherein the said supporting step includes wrapping the substrate partially around a supporting cylinder having a surface in confronting relationship to the respective openings, and wherein said transporting step includes rotating the cylinder so that the substrate passes to and from the first and second deposition means in sequence.

3. The method of claim 1 and additionally comprising the step of cooling the supporting means.

4. The method of claim 3 and additionally comprising the step of establishing thermoconductivity between the supporting means and the substrate.

* * * * *